United States Patent
Liu et al.

(10) Patent No.: US 10,297,730 B2
(45) Date of Patent: May 21, 2019

(54) LED DEVICE, METHOD FOR MANUFACTURING AN LED DEVICE, AND LED DISPLAY MODULE

(71) Applicant: Foshan NationStar Optoeletronics Co., Ltd., Guangdong (CN)

(72) Inventors: Chuanbiao Liu, Guangdong (CN); Hu Xu, Guangdong (CN); Xiaofeng Liu, Guangdong (CN); Zhuang Peng, Guangdong (CN); Aidi Chen, Guangdong (CN); Ling Li, Guangdong (CN); Hongxin Chen, Guangdong (CN)

(73) Assignee: Foshan NationStar Optoelectronics Co., Ltd., Guangdong (CN)

( * ) Notice: Subject to any disclaimer, the term of this patent is extended or adjusted under 35 U.S.C. 154(b) by 0 days.

(21) Appl. No.: 15/816,126

(22) Filed: Nov. 17, 2017

(65) Prior Publication Data
US 2018/0151784 A1 May 31, 2018

(30) Foreign Application Priority Data

Nov. 30, 2016 (CN) .......................... 2016 2 1299020

(51) Int. Cl.
| | |
|---|---|
| *H01L 33/54* | (2010.01) |
| *H01L 25/075* | (2006.01) |
| *H01L 33/62* | (2010.01) |
| *H01L 33/48* | (2010.01) |
| *H01L 33/60* | (2010.01) |

(52) U.S. Cl.
CPC .......... *H01L 33/54* (2013.01); *H01L 25/0753* (2013.01); *H01L 33/486* (2013.01); *H01L 33/60* (2013.01); *H01L 33/62* (2013.01); *H01L 2933/005* (2013.01); *H01L 2933/0058* (2013.01); *H01L 2933/0066* (2013.01)

(58) Field of Classification Search
CPC ......... H01L 33/52; H01L 33/54; H01L 33/56; H01L 33/58; H01L 33/60
See application file for complete search history.

(56) References Cited

U.S. PATENT DOCUMENTS

| | | | |
|---|---|---|---|
| 10,141,488 B2* | 11/2018 | Nakabayashi | ........ H01L 33/502 |
| 2011/0235323 A1* | 9/2011 | Allegri | .................... F21V 5/002 |
| | | | 362/232 |

(Continued)

FOREIGN PATENT DOCUMENTS

JP 2012151466 8/2012

*Primary Examiner* — Victoria K. Hall
(74) *Attorney, Agent, or Firm* — Barnes & Thornburg LLP; Jeffrey Stone

(57) ABSTRACT

An LED device, a method for manufacturing an LED device, and an LED display module are provided. The LED device includes an LED bracket, an LED chip and an encapsulation sealant. The LED bracket includes a metal bracket and a cup cover encasing the metal bracket. The cup cover includes a reflective cup having a cavity. The LED chip is fixed in the cavity of the reflective cup. The cavity of the reflective cup is filled with the encapsulation sealant. The encapsulation sealant includes an under sealant and a surface sealant. The under sealant covers the LED chip, and the surface sealant covers the under sealant. The under sealant is a transparent layer. The surface sealant is a matte layer.

15 Claims, 2 Drawing Sheets

(56) References Cited

U.S. PATENT DOCUMENTS

| | | | | |
|---|---|---|---|---|
| 2012/0161621 A1* | 6/2012 | Sato | ............... | H01L 33/54 |
| | | | | 313/512 |
| 2014/0346545 A1* | 11/2014 | Chan | ............... | H01L 33/54 |
| | | | | 257/98 |
| 2015/0169011 A1* | 6/2015 | Bibl | ............... | G06F 3/0412 |
| | | | | 345/175 |
| 2015/0263208 A1* | 9/2015 | Fisher | ............... | C08L 83/04 |
| | | | | 136/259 |
| 2018/0351054 A1* | 12/2018 | Chen | ............... | H01L 33/507 |

* cited by examiner

LED DEVICE, METHOD FOR MANUFACTURING AN LED DEVICE, AND LED DISPLAY MODULE

CROSS-REFERENCES TO RELATED APPLICATIONS

This application claims priority to Chinese patent application No. 201621299020.4, filed on Nov. 30, 2016, the disclosure of which is incorporated herein by reference in its entirety.

TECHNICAL FIELD

The present disclosure relates to the field of LED technology, and, in particular, to an LED device, a method for manufacturing an LED device, and an LED display module.

BACKGROUND

An existing LED device typically includes an LED bracket, an LED chip and an encapsulation sealant. The LED bracket includes a metal bracket and a cup cover encasing the metal bracket. When the LED device is to emit light, a PN junction of the LED chip is powered and conductive, and the LED chip converts electric energy into light energy to emit light. The LED bracket, the LED chip or the encapsulation sealant may affect a light emission effect or a display effect of the LED device.

Therefore, how to improve the light emission effect or the display effect by improving designs of the LED bracket, the LED chip or the encapsulation sealant remains a problem to be solved in the LED field.

SUMMARY

An embodiment of the present disclosure provides an LED device having advantages of a high brightness, a low stress and a matte effect.

In a first aspect, an embodiment of the present disclosure provides an LED device. The LED device includes an LED bracket, an LED chip and an encapsulation sealant, wherein the LED bracket includes a metal bracket and a cup cover encasing the metal bracket, the cup cover includes a reflective cup having a cavity, the LED chip is fixed in the cavity of the reflective cup, the cavity of the reflective cup is filled with the encapsulation sealant, the encapsulation sealant includes an under sealant and a surface sealant, the under sealant covers the LED chip, the surface sealant covers the under sealant, the under sealant is a transparent layer and the surface sealant is a matte layer.

In a second aspect, an embodiment of the present disclosure provides a method for manufacturing an LED device, including:

manufacturing an LED bracket: forming a metal bracket with a pad by providing a metal base material, punching the metal base material and plating a metal or alloy material on a surface of the metal base material; after plating, forming a cup cover encasing the metal bracket by injection molding on the metal bracket, wherein the cup cover includes a reflective cup having a cavity, and the pad is in the cavity; and after injection molding, bending the metal base material around the cup cover, to form the LED bracket including a first metal pin embedded in the cup cover and a second metal pin exposed outside the cup cover;

installing an LED chip: fixing the LED chip on the pad of the LED bracket; and filling with sealant: filling the cavity of the LED bracket with an under sealant, covering a surface sealant on the under sealant after the under sealant is cured, and punching after the surface sealant is cured to forming the LED device.

In a third aspect, an embodiment of the present disclosure provides an LED display module. The LED display module includes a PCB, a driver IC, and LED devices of the first aspect. Two or more of the LED devices are arranged on a first surface of the PCB and the driver IC is fixed to a second surface of the PCB.

BRIEF DESCRIPTION OF DRAWINGS

FIG. 5 is a schematic diagram of an LED display module. In the figures:

1: LED bracket; 11: metal bracket; 12: cup cover;
13: light-absorbing layer; 111: first metal pin; 112: second metal pin;
121: reflective cup;
2: LED chip;
3: encapsulation sealant; 31: under sealant; 32: surface sealant.

DETAILED DESCRIPTION

In the description of embodiments of the present disclosure, unless otherwise expressly specified and limited, the terms "contact", "connect" or "fix" is to be construed in a broad sense, and for example, may refer to fixed connection or detachable connection or integral connection, may refer to mechanical connection or electrical connection and may refer to direct connection or indirect connection through an intermediate medium or inner communication of two elements or interaction of two elements. For those of ordinary skill in the art, specific meanings of the above terms in embodiments of the present invention may be understood according to specific conditions.

Figure 1:
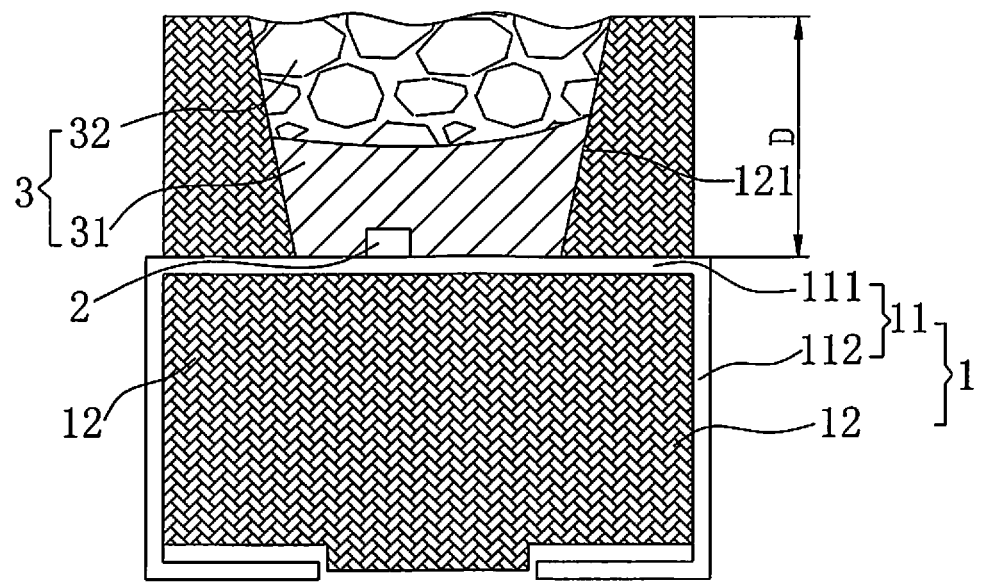
FIG. 1 is a structural diagram of an LED device according to an embodiment of the present disclosure.
Figure 4:
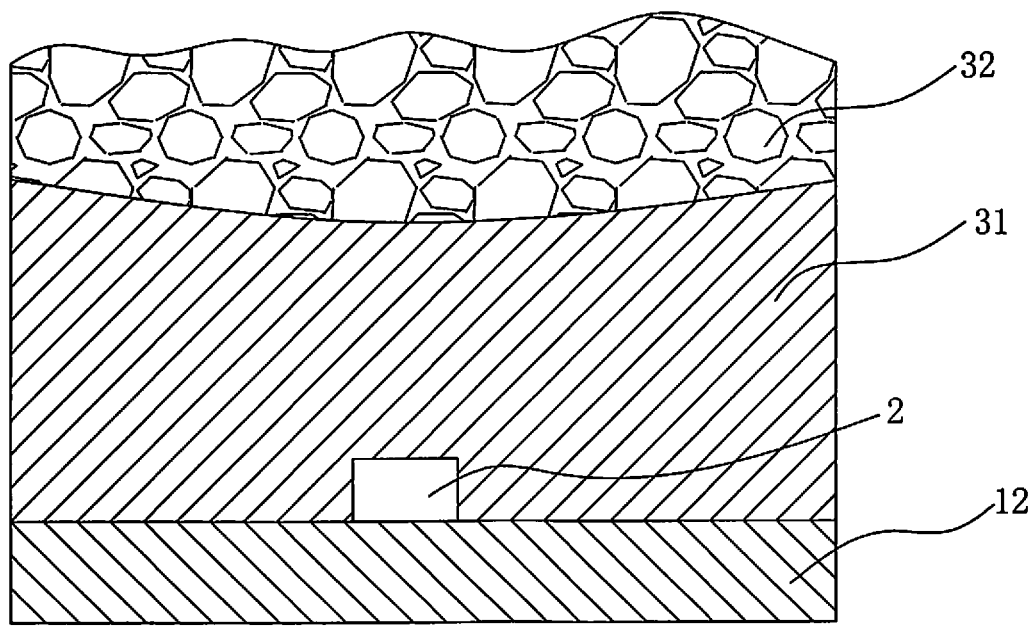
FIG. 4 is a partial structural diagram of an LED device according to an embodiment of the present disclosure.

In embodiments of the present invention, unless otherwise explicitly specified and defined, a condition that a first feature is "above" or "below" a second feature may include direct contact between the first feature and the second feature, and may also include contact through additional features between the first feature and the second feature rather than direct contact between the first feature and the second feature. Moreover, a condition that the first feature is "above", "at an upper part" and "at an upper side" of the second feature may include that the first feature is directly over and above the second feature, or only indicates that a horizontal height of the first feature is higher than that of the second feature. A condition that the first feature is "below", "at a lower part" and "at a lower side" of the second feature may include that the first feature is directly under and below the second feature, or only indicates that a horizontal height of the first feature is smaller than that of the second feature FIG. 1 is a structural diagram of an LED device according to embodiments of the present disclosure. FIG. 4 is a partial structural diagram of an LED device according to embodiments of the present disclosure. Referring to FIGS. 1 and 4, the LED device includes an LED bracket 1, an LED chip 2 and an encapsulation sealant 3. The LED bracket 1 includes a metal bracket 11 and a cup cover 12 encasing the metal bracket 11. The metal bracket 11 includes a first metal pin 111 embedded in the cup cover 12 and a second metal pin 112 exposed outside the cup cover 12; the cup cover 12 includes a reflective cup 121 having a cavity, a pad is provided in the cavity, the LED chip 2 is fixed to the pad so as to be fixed in the cavity of the reflective cup 121, the cavity of the reflective cup 121 is filled with the encapsulation sealant 3, and the encapsulation sealant 3 covers the LED chip 2.

The pad includes a die attach pad for fixing the LED chip, a wiring pad for wire bonding and an electrode pad for connecting an electrode of the LED chip. LED chip wiring and fixation modes vary according to the types and numbers of the LED chips. The LED chip 2 in the embodiment of the present disclosure is one of, a combination of two of or a combination of three of a red LED chip, a green LED chip and a blue LED chip. For example, in some embodiments, the LED chip 2 includes one red LED chip, one green LED chip and one blue LED chip.

In some embodiments, the cup cover 12 of the embodiment of the present disclosure is made of black PPA resin with a high brightness and a low stress.

The encapsulation sealant 3 of the embodiment of the present disclosure includes an under sealant 31 and a surface sealant 32. The under sealant 31 covers the LED chip 2. The surface sealant 32 covers the under sealant 31. It is to be understood that when the number of the LED chips 2 is two or more, the under sealant 31 covers all the LED chips 2. When the LED chip 2 is connected to the pad by a bonding wire, the under sealant 31 covers all the LED chips 2 and the bonding wire.

If only a transparent colloid is selected as the encapsulation sealant 3, the colloid has no matte effect. The frosted colloid contains a large quantity of frosted particles. If the encapsulation sealant 3 only includes the frosted colloid, the encapsulation sealant 3 undergoes uneven heating during a curing process and the solvent volatilizes unevenly, and the consistency of the colloid surface is poor after the colloid is cured. Therefore, in the embodiment of the present disclosure, the encapsulation sealant 3 includes the under sealant 31 and the surface sealant 32. The under sealant 31 is configured as a transparent layer. The surface sealant 32 is configured as a matte layer. With such design, the under sealant 31 as the transparent layer has a high light transmittance and a low light intensity loss and the surface sealant 32 as the matte layer has a matte effect. Thus, a combination of the under sealant 31 and the surface sealant 32 enables the LED device to have a high brightness, a low stress and a matte effect.

The under sealant 31 as the transparent layer is made of a sealant with a high light transmittance. The light transmittance of the under sealant 31 is greater than or equal to 70%. The surface sealant 32 as the matte layer is made of a sealant with a matte effect. As illustrated in FIG. 4, the surface sealant 32 has a concavo-convex surface so as to achieve the matte effect with diffuse reflection.

The embodiment of the present disclosure achieves a high light transmittance and a matte effect via a combination of the under sealant 31 as the transparent layer and the surface sealant 32 as the matte layer, so the amount of used under sealant 31 and surface sealant 32 is an important factor in ensuring the above effects. In the embodiment of the present disclosure, a ratio of a thickness the surface sealant 32 to a thickness of the under sealant 31 is ½ to ⅔. Although the surface sealant 32 contains a large quantity of frosted particles, the small amount of used surface sealant 32 can ensure that the surface sealant 32 is heated evenly during the curing process, the solvent volatilizes evenly and the curing rate is high, and can ensure that the frosted particles float in the upper layer of the surface sealant 32 and the consistency of the colloid surface is good after curing. The LED device using the above sealant achieves high-brightness and full-matte effects, and ensures that the surface sealant 32 covers the under sealant 31 and fills the cup surface, causing a low products variation and a good smoothness.

In the embodiment of the present disclosure, a depth of the cavity of the reflective cup 121 of the LED bracket 1 is denoted as D, the thickness of the under sealant 31 is configured such that the under sealant 31 at least covers all of the LED chips 2 and the bonding wires, and the thickness of the under sealant 31 is less than or equal to $$\frac{3}{4}D.$$

The amount of used under sealant 31 is determined based on the above configuration, so that the combination of the under sealant 31 and the surface sealant 32 achieves a high light transmittance and a matte effect. In other embodiments of the present disclosure, the thickness of the under sealant 31 is less than or equal to $$\frac{4}{7}D.$$

It is to be understood that the thickness of the surface sealant 32 is an average thickness of the surface sealant 32 and the thickness of the under sealant 31 is an average thickness of the under sealant 31.

In the embodiment of the present disclosure, an interface between the under sealant 31 and the surface sealant 32 is a flat surface or a cambered surface. In some embodiments of the present disclosure, the interface between the under sealant 31 and the surface sealant 32 is a cambered surface bent towards the surface sealant 32. Such design enables a light focusing effect.

Figure 2:
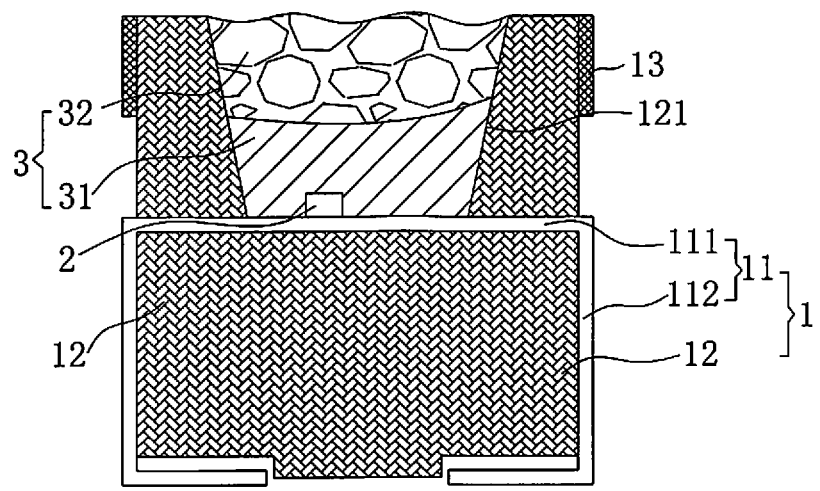
FIG. 2 is a structural diagram of another LED device according to an embodiment of the present disclosure.
Figure 3:
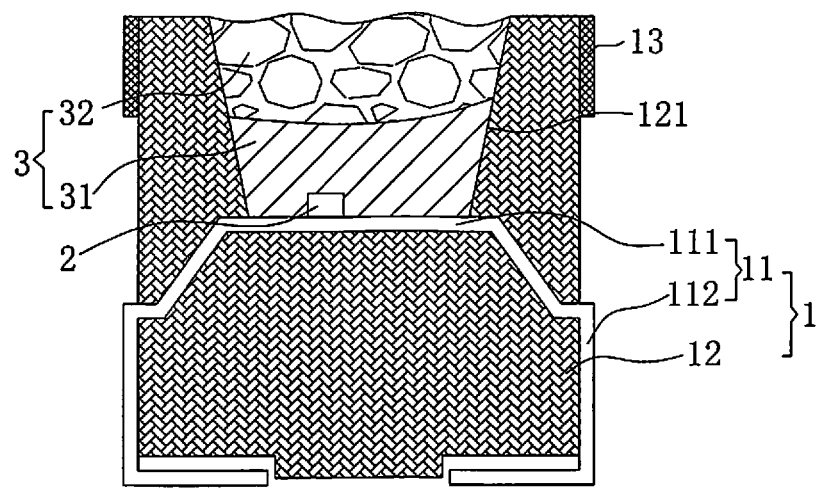
FIG. 3 is a structural diagram of another LED device according to an embodiment of the present disclosure.

In the LED bracket 1 provided by the embodiment of the present disclosure, the first metal pin 111 has at least two structural types. For example, in an example illustrated in FIG. 2, the first metal pin 111 is set as a non-bent structure. In an example illustrated in FIG. 3, the first metal pin 111 is set as a bent structure.

Another embodiment of the present disclosure provides a method for manufacturing an LED device, including steps step (1) to step (3).

At step (1), an LED bracket is manufactured. A metal bracket 11 with a pad is formed by providing a metal base material, punching the metal base material and plating a metal or alloy material on a surface of the metal base material. After plating, a cup cover 12 encasing the metal bracket 11 is formed by injection molding on the metal bracket 11, where the cup cover 12 includes a reflective cup 121 having a cavity, and the pad is in the cavity. After injection molding, the metal base material is bent around the cup cover 12 to form the LED bracket 1 including a first metal pin 111 embedded in the cup cover 12 and a second metal pin 112 exposed outside the cup cover 12.

At step (2), an LED chip is installed. The LED chip 2 is fixed on the pad of the LED bracket 1.

Step (3) is a sealant filling step. At step (3), the cavity of the LED bracket 1 is filled with an under sealant 31, a surface sealant 32 covers on the under sealant 31 after the under sealant 31 is cured, and after the surface sealant 32 is cured, the LED device is punched and the manufacturing of LED device is completed.

In some examples of the present disclosure, the metal base material described in the step (1) employs a copper strip or an iron strip.

In some examples of the present disclosure, at the step (1), a black PPA material is injection-molded to the metal base material to form the cup cover. In some other examples of the present disclosure, at the step (1), a white PPA material is injection-molded to the metal base material to form the cup cover, and a light-absorbing layer 13 is formed on an outer side and/or a top end face of the reflective cup 121 of the cup cover 12 by printing or spraying (referring to FIGS. 2 and 3). The light-absorbing layer may be made of black ink or black paint. Such design ensures a desirable brightness and contrast ratio of the LED device.

In some examples of the present disclosure, the pad includes a die attach pad for fixing the LED chip, a wiring pad for wire bonding and an electrode pad for connecting an electrode of the LED chip. At the step (2), the LED chip is fixed to and electrically connected to the die attach pad, and then the electrode of the LED chip is connected to the wiring pad by wire bonding.

In some other examples of the present disclosure, at the step (2), the LED chip is fixed to the die attach pad, and then the electrode of the LED chip is connected to the wiring pad and the electrode pad separately via bonding wires.

In some other examples of the present disclosure, at the step (2), the LED chip is directly electrically connected to the electrode pad. This situation occurs in an LED flip-chip case, where the LED chip can be directly electrically connected to the electrode pad instead of being connected to the pad by the bonding wire.

In some other examples of the present disclosure, at the step (3), firstly, the cavity of the LED bracket 1 is filled with the under sealant 31 by means of dispensing, spraying or printing, the surface sealant 32 covering the under sealant 31 is formed by means of dispensing, spraying or printing after the under sealant 31 is cured, and after the surface sealant 32 is cured, the LED device is punched and the manufacturing of LED device is completed.

Embodiments of the present disclosure further provide an LED display module. As shown in FIG. 5, the LED display module includes a PCB, a driver IC and the above-mentioned LED devices. Two or more LED devices described above are arranged on one surface of the PCB and the driver IC is fixed to the other surface of the PCB.

In illustration of the description, the reference terms such as "an embodiment", "an example" and the like means that specific features, structures, materials or characteristics illustrated by combining with the embodiment or the example are included in at least one embodiment or example of the present invention. In the description, schematic expression of the above terms does not necessarily refer to the same embodiment or example. Moreover, the illustrated specific features, structures, materials or characteristics can be combined in any one or more embodiments or examples in a proper manner.

What is claimed is:

1. A light emitting diode (LED) device, comprising: an LED bracket, an LED chip and an encapsulation sealant, wherein the LED bracket includes a metal bracket and a cup cover encasing the metal bracket, the cup cover includes a reflective cup having a cavity, the LED chip is fixed in the cavity of the reflective cup, the cavity of the reflective cup is filled with the encapsulation sealant, the encapsulation sealant includes an under sealant and a surface sealant, the under sealant covers the LED chip, the surface sealant covers the under sealant, the under sealant is a transparent layer and the surface sealant is a matte layer, wherein a ratio of a thickness of the surface sealant to a thickness of the under sealant is ½ to ⅔.

2. The LED device of claim 1, wherein the matte layer is a frosted layer.

3. The LED device of claim 1, wherein an interface between the under sealant and the surface sealant is a flat surface.

4. The LED device of claim 1, wherein an interface between the under sealant and the surface sealant is a cambered surface.

5. The LED device of claim 4, wherein the interface between the under sealant and the surface sealant is a cambered surface bent towards the surface sealant.

6. The LED device of claim 1, wherein the LED chip is one of, a combination of two of or a combination of three of a red LED chip, a green LED chip and a blue LED chip.

7. The LED device of claim 1, wherein a light transmittance of the under sealant is greater than or equal to 70%.

8. A method for manufacturing a light emitting diode (LED) device, comprising:
   manufacturing an LED bracket: forming a metal bracket with a pad by providing a metal base material, punching the metal base material and plating a metal or alloy material on a surface of the metal base material; after plating, forming a cup cover encasing the metal bracket by injection molding on the metal bracket, wherein the cup cover includes a reflective cup having a cavity, and the pad is in the cavity; and after injection molding, bending the metal base material around the cup cover, to form the LED bracket including a first metal pin embedded in the cup cover and a second metal pin exposed outside the cup cover;
   installing an LED chip: fixing the LED chip on the pad of the LED bracket; and
   filling with encapsulation sealant: filling the cavity of the LED bracket with an under sealant, covering a surface of the under sealant with a surface sealant after the under sealant is cured, and after the surface sealant is cured forming the LED device,
   wherein the under sealant is a transparent layer and the surface sealant is a matte layer, wherein a ratio of a thickness of the surface sealant to a thickness of the under sealant is ½ to ⅔.

9. The method of claim 8, wherein the filling the cavity of the LED bracket with an under sealant comprises: filling the cavity of the LED bracket with the under sealant by means of dispensing, spraying or printing; and covering a surface of the under sealant with a surface sealant comprises: forming the surface sealant on the under sealant by means of dispensing, spraying or printing.

10. A light emitting diode (LED) display module, comprising: a printed circuit board (PCB), a driver integrated circuit (IC), and LED devices, wherein two or more of the LED devices are arranged on a first surface of the PCB and the driver IC is fixed on a second surface of the PCB,
   wherein each of the LED devices comprises: an LED bracket, an LED chip and an encapsulation sealant, wherein the LED bracket includes a metal bracket and a cup cover encasing the metal bracket, the cup cover includes a reflective cup having a cavity, the LED chip is fixed in the cavity of the reflective cup, the cavity of the reflective cup is filled with the encapsulation sealant, the encapsulation sealant includes an under sealant and a surface sealant, the under sealant covers the LED chip, the surface sealant covers the under sealant, the under sealant is a transparent layer and the surface sealant is a matte layer, wherein a ratio of a thickness of the surface sealant to a thickness of the under sealant is ½ to ⅔.

11. The LED display module of claim 10, wherein the matte layer is a frosted layer.

12. The LED display module of claim 10, wherein an interface between the under sealant and the surface sealant is a flat surface.

13. The LED display module of claim 10, wherein an interface between the under sealant and the surface sealant is a cambered surface.

14. The LED display module of claim 13, wherein the interface between the under sealant and the surface sealant is a cambered surface bent towards the surface sealant.

15. The LED display module of claim 10, wherein the LED chip is one of, a combination of two of or a combination of three of a red LED chip, a green LED chip and a blue LED chip.

* * * * *